United States Patent
Kolics et al.

(10) Patent No.: US 9,058,975 B2
(45) Date of Patent: Jun. 16, 2015

(54) CLEANING SOLUTION FORMULATIONS FOR SUBSTRATES

(75) Inventors: Artur Kolics, Dublin, CA (US); Fritz Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 703 days.

(21) Appl. No.: 12/205,896

(22) Filed: Sep. 7, 2008

(65) Prior Publication Data

US 2009/0065735 A1 Mar. 12, 2009

Related U.S. Application Data

(63) Continuation-in-part of application No. 11/760,722, filed on Jun. 8, 2007, now Pat. No. 7,772,128.

(60) Provisional application No. 60/804,425, filed on Jun. 9, 2006.

(51) Int. Cl.
| | |
|---|---|
| *C09K 13/04* | (2006.01) |
| *C11D 7/32* | (2006.01) |
| *H01L 21/02* | (2006.01) |
| *C09K 13/00* | (2006.01) |
| *C11D 7/16* | (2006.01) |
| *C11D 7/26* | (2006.01) |
| *C11D 7/34* | (2006.01) |
| *C11D 11/00* | (2006.01) |

(52) U.S. Cl.
CPC .......... *H01L 21/02057* (2013.01); *C09K 13/00* (2013.01); *C11D 7/16* (2013.01); *C11D 7/261* (2013.01); *C11D 7/3281* (2013.01); *C11D 7/34* (2013.01); *C11D 11/0047* (2013.01)

(58) Field of Classification Search
CPC .......... C09K 13/00; C09K 15/00; C11D 7/00; C11D 7/02; C11D 7/22; C11D 7/16
USPC .................. 252/500, 79.1; 510/175, 177, 470; 134/2, 3, 26, 28, 29, 30
See application file for complete search history.

(56) References Cited

U.S. PATENT DOCUMENTS

| | | | |
|---|---|---|---|
| 5,972,862 A * | 10/1999 | Torii et al. ................ | 510/175 |
| 6,430,026 B1 | 8/2002 | Nagato et al. | |
| 7,208,049 B2 | 4/2007 | Zhang et al. | |
| 2001/0052351 A1 | 12/2001 | Brown et al. | |
| 2003/0000083 A1 | 1/2003 | Takahashi | |
| 2003/0143495 A1 | 7/2003 | Ishikawa et al. | |
| 2003/0158059 A1 * | 8/2003 | Sakai et al. ................ | 510/175 |
| 2003/0216270 A1 | 11/2003 | Abe et al. | |
| 2004/0077295 A1 * | 4/2004 | Hellring et al. ............ | 451/41 |
| 2004/0161933 A1 * | 8/2004 | Takashima et al. ......... | 438/689 |
| 2005/0197266 A1 | 9/2005 | Misra et al. | |
| 2005/0288199 A1 | 12/2005 | Oowada et al. | |
| 2006/0003570 A1 | 1/2006 | Shanmugasundram et al. | |
| 2006/0014391 A1 | 1/2006 | Lee et al. | |
| 2006/0014656 A1 * | 1/2006 | Egbe et al. ............... | 510/175 |
| 2006/0040838 A1 * | 2/2006 | Shimada et al. ............ | 510/175 |
| 2006/0112972 A1 * | 6/2006 | Peitersen et al. ............ | 134/26 |
| 2006/0199749 A1 * | 9/2006 | Suzuki et al. ............. | 510/175 |
| 2007/0060490 A1 * | 3/2007 | Skee ...................... | 510/175 |
| 2007/0087949 A1 * | 4/2007 | Wu et al. ................. | 510/175 |
| 2007/0111523 A1 * | 5/2007 | Emesh et al. .............. | 438/687 |
| 2007/0179072 A1 * | 8/2007 | Rao et al. ................ | 510/175 |
| 2007/0235061 A1 | 10/2007 | Mizuta et al. | |
| 2008/0214006 A1 | 9/2008 | Lee et al. | |
| 2009/0162537 A1 | 6/2009 | Kolics et al. | |

FOREIGN PATENT DOCUMENTS

| | | |
|---|---|---|
| JP | 2002-69495 | 3/2002 |
| JP | 2006-49881 | 2/2006 |
| JP | 2008-205400 | 9/2008 |
| WO | WO 2005/040324 | 5/2005 |
| WO | WO 2006/129549 | 12/2006 |
| WO | WO 2007/146848 A3 | 12/2007 |
| WO | WO 2008/023214 A1 | 2/2008 |

OTHER PUBLICATIONS

"Cobratec.pdf" Cobratec Metal protection website www.metalprotection.com, properties of Cobratec 99, Cobratec TT100 and Cobratec TT50S. copyright 2000.*
International Search Report for PCT/US2009/55943, Kolics et al., Mailed on Oct. 22, 2009.
Office Action dated Apr. 5, 2013 for U.S. Appl. No. 12/205,894.
Office Action dated Nov. 24, 2010 for U.S. Appl. No. 12/205,894, filed Sep. 7, 2008.
Office Action dated Jun. 14, 2011 for U.S. Appl. No. 12/205,894, filed Sep. 7, 2008.
Office Action dated Oct. 26, 2011 for U.S. Appl. No. 12/205,894, filed Sep. 7, 2008.
Office Action dated Nov. 5, 2013 from Japanese Application No. 2011-526209.

* cited by examiner

*Primary Examiner* — Jane L Stanley
(74) *Attorney, Agent, or Firm* — Beyer Law Group LLP

(57) ABSTRACT

Presented is a cleaning solution according to one embodiment of the present invention that includes a corrosion inhibitor, a solubilizing agent, an oxygen scavenger, and a complexing agent also capable as a pH adjustor. Another embodiment of the present invention includes cleaning solutions that include a pH adjustor, an optional complexing agent, and a corrosion inhibitor. The cleaning solutions may have a solubilizing agent optionally present, may have a surfactant optionally present, and may have a dielectric etchant optionally present.

11 Claims, No Drawings

CLEANING SOLUTION FORMULATIONS FOR SUBSTRATES

CROSS REFERENCES

This is a continuation in part application of U.S. patent application Ser. No. 11/760,722, filed Jun. 8, 2007, now U.S. Pat. No. 7,772,128 which claims the benefit of U.S. Provisional Patent Application Ser. No. 60/804,425 filed Jun. 9, 2006. The contents of U.S. patent application Ser. No. 11/760,722, filed Jun. 8, 2007, and the contents of U.S. Provisional Patent Application Ser. No. 60/804,425, filed Jun. 9, 2006, are incorporated herein, in their entirety, by this reference for all purposes.

BACKGROUND

This invention pertains to fabrication of electronic devices such as integrated circuits; more specifically, this invention relates to cleaning solution formulations for substrates having metal lines with a cap and a dielectric to form metallization structures.

Electroless plated caps can be used in electronic devices to improve the electromigration and stress-migration properties of metallization structures. Electroless deposition processes are wet chemical processes. Such processes are often used with wet cleaning processes to clean the substrates. Although liquid solutions are known for numerous cleaning applications, the present inventors have recognized a need for new and/or improved cleaning solution formulations and methods suitable to clean substrates for the manufacture of electronic devices.

SUMMARY

This invention pertains to fabrication of electronic devices. One embodiment of the present invention is a cleaning solution comprising a corrosion inhibitor, a solubilizing agent, an oxygen scavenger, and a complexing agent also capable as a pH adjustor. Another embodiment of the present invention is a cleaning solution that may comprise a pH adjustor, an optional complexing agent, and a corrosion inhibitor; the cleaning solution may also include one or more of a solubilizing agent, a dielectric etchant, and a surfactant.

It is to be understood that the invention is not limited in its application to the details of construction and to the arrangements of the components set forth in the following description. The invention is capable of other embodiments and of being practiced and carried out in various ways. In addition, it is to be understood that the phraseology and terminology employed herein are for the purpose of description and should not be regarded as limiting.

DESCRIPTION

For the following defined terms, these definitions shall be applied, unless a different definition is given in the claims or elsewhere in this specification. All numeric values are herein defined as being modified by the term "about," whether or not explicitly indicated. The term "about" generally refers to a range of numbers that a person of ordinary skill in the art would consider equivalent to the stated value to produce substantially the same properties, function, result, etc. A numerical range indicated by a low value and a high value is defined to include all numbers subsumed within the numerical range and all subranges subsumed within the numerical range. As an example, the range 10 to 15 includes, but is not limited to, 10, 10.1, 10.47, 11, 11.75 to 12.2, 12.5, 13 to 13.8, 14, 14.025, and 15.

The present invention pertains to interconnect metallization that uses an electrically conductive metal with a cap and a dielectric forming a damascene metallization structure for electronic devices such as integrated circuits. More specifically, the present invention is directed toward cleaning solution formulations for cleaning substrates for electronic devices. For some applications, the interconnect metallization layers include a dielectric and a metal, such as copper.

Embodiments of the present invention will be discussed below primarily in the context of processing semiconductor wafers such as silicon wafers used for fabricating integrated circuits. The metallization layers for the integrated circuits include copper for metal lines formed into damascene and/or dual damascene dielectric structures. The copper metal lines have electrolessly deposited caps. Some preferred caps are multi-element alloys such as cobalt alloy, cobalt-tungsten alloy, cobalt-tungsten-phosphorous-boron alloy, cobalt-nickel alloy, and nickel alloy. Optionally, the dielectric is a low k dielectric material such as a carbon doped silicon oxide (SiOC:H). However, it is to be understood that embodiments in accordance with the present invention may be used for other semiconductor devices, metals other than copper, caps with metals other than nickel and/or cobalt, and wafers other than semiconductor wafers.

For some applications, cleaning solutions according to embodiments of the present invention can be used to clean substrates after deposition of the cap. The cleaning solutions may be capable of removing contaminants such as ions left on the dielectric surface between the capped copper interconnect structures. The removal of such contaminants may produce results such as improved leakage current properties, improved voltage breakdown properties, and improved time-dependent dielectric breakdown performance.

Section 1

A cleaning solution according to one embodiment of the present invention comprises a corrosion inhibitor, a solubilizing agent, an oxygen scavenger, and a complexing agent also capable as a pH adjustor. Optionally, for some embodiments of the present invention the cleaning solution is an aqueous solution. However, other embodiments of the present invention may be non-aqueous cleaning solutions wherein a non-aqueous liquid is used instead of water.

Generally, cleaning solutions according to embodiments of the present invention have a pH less than or equal to 3. Optionally, the pH of the cleaning solution may be less than or equal to 2.5 for some embodiments. Preferred embodiments of the present invention include the cleaning solution having a pH up to about 2.3.

Corrosion Inhibitor(s)

As stated above, cleaning solutions according to embodiments of the present invention include a corrosion inhibitor. Optionally the cleaning solution may contain more than one corrosion inhibitor. One of the functions of the corrosion inhibitor may be to substantially protect the cap or retard the dissolution of the cap in the cleaning solution. For some applications, the cleaning solutions according to embodiments of the present invention are configured so as to clean the substrate with negligible or substantially no reduction in the thickness of the cap. The one or more corrosion inhibitors may be included in embodiments of the present invention for that purpose.

Numerous compounds are suitable for use as corrosion inhibitors in cleaning solutions according to embodiments of the present invention. A list of corrosion inhibitors for embodiments of the present invention includes, but is not limited to, triazole and its derivatives such as benzotriazole, methyl-benzotriazole, 5-methyl-benzotriazole (Chemical Abstracts Services (CAS) #[136-85-6]), carboxy-benzotriazole, hydroxybenzotriazole, and derivatives such as mercaptobenzothiazole; polyvinylpyrrolidone; polyvinylalcohol and its derivatives; polyamines; polyimines; polyalkylimines; polyethylenimines; long chain alkylamines; tetrazoles; phosphates such as but not limited to inorganic phosphates, alkylphosphates, fluoralkylphosphates; metaphosphates; phosphites; phosphonates such as but not limited to alkylphosphonates; fluoroalkylphosphonates; silicates; alkoxysilanes, nitrites; bicyclohexylammonium nitrite; derivatives thereof; and combinations thereof.

Generally, an effective amount of corrosion inhibitor is provided in cleaning solutions. In other words, the amount of corrosion inhibitor in the cleaning solution is selected so that the cleaning solution is effective in cleaning the substrate and providing satisfactory prevention of corrosion of the cap. For some embodiments of the present invention the cleaning solutions contain one or more corrosion inhibitors with each of the corrosion inhibitors present in the cleaning solution in a concentration range of 0.1 to 50 millimolar (mM). As an option for some cleaning solutions according to embodiments of the present invention, the corrosion inhibitor is present at a concentration between 0.1 to 10000 parts per million (ppm) and all subranges subsumed therein. As another option, the corrosion inhibitor is present at a concentration between 100 to 2000 ppm and all subranges subsumed therein. Cleaning solutions according to specific embodiments of the present invention are, but are not limited to the following. A cleaning solution wherein the corrosion inhibitor is a triazole compound. A cleaning solution wherein the corrosion inhibitor comprises a toluol triazole or a benzotriazole. A cleaning solution wherein the corrosion inhibitor comprises a triazole compound at a concentration between 0.1 to 10000 ppm and all subranges subsumed therein. A cleaning solution wherein the corrosion inhibitor comprises a triazole compound at a concentration between 100 to 2000 ppm and all subranges subsumed therein.

Solubilizing Agent(s)

As an option, some embodiments of the present invention may include a cleaning solution that also contains one or more solubilizing agents. The solubilizing agent in embodiments of the present invention is a substance that increases the solubility in a liquid such as water of another material that may be only partially soluble in the liquid. The solubilizing agent for some embodiments of the present invention may be provided so as to increase the solubility of one or more of the corrosion inhibitors so as to produce a single phase for the cleaning solution. For some situations, the solubilizing agent may be provided so as to solubilize the corrosion inhibitor into the water for embodiments of the present invention that are aqueous solutions and the corrosion inhibitor has a low or an insufficient solubility in water. Optionally, the solubilizing agent may be included so as to perform tasks such as to help remove organic contaminants from the surface of the substrate.

Numerous compounds are suitable for use as solubilizing agents in embodiments of the present invention. A list of solubilizing agents for embodiments of the present invention includes, but is not limited to, primary alcohols, secondary alcohols, tertiary alcohols, isopropyl alcohol, alcohols having multiple hydroxy groups such as polyols, glycols, ethylene glycol (CAS #[107-21-1]), propylene glycol, 2-n-butoxyethanol, dimethylsulfoxide (DMSO), propylenecarbonate, and combinations thereof. Some embodiments of the present invention may include one or more solubilizing agents present in the cleaning solution.

Embodiments of the present invention use an effective amount of solubilizing agent. This means that the amount of solubilizing agent present in the cleaning solution is effective so as to produce a single phase solution. The specific amount will depend on factors such as the amount and properties of the corrosion inhibitor that is included in the cleaning solution. Some corrosion inhibitors may require the use of the solubilizing agent whereas other corrosion inhibitors may have a sufficient solubility in water for aqueous cleaning solutions or other non-aqueous cleaning solutions so that the solubilizing agent is not needed in the cleaning solution. For aqueous cleaning solutions according to one or more embodiments of the present invention, the amount of solubilizing agent may be present at concentrations from 0 up to about 200 milliliters/liter (mL/L) of cleaning solution.

Oxygen Scavenger(s)

Cleaning solutions according to some embodiments of the present invention include one or more oxygen scavengers. The oxygen scavengers are compounds that can be used to remove dissolved oxygen or other oxidizing species from the cleaning solution. More specifically, the oxygen scavenger reduces the concentration of dissolved oxygen or other oxidizing species in the cleaning solution. For some applications, the amount of dissolved oxygen is kept to a minimum so as to substantially prevent oxidation of the cap by the dissolved oxygen or other oxidizing species.

Numerous compounds are suitable for use as oxygen scavengers for dissolved oxygen and other oxidizing species. A list of oxygen scavengers for embodiments of the present invention includes, but is not limited to, L-ascorbic acid (CAS #[50-81-7]), D-ascorbic acid, derivatives of ascorbic acid, chlorogenic acid, caffeic acid, luteolin, sulfites such as, but not limited to, ammonium sulfite and tetramethylammonium sulfite, and combinations thereof.

Generally, an effective amount of one or more oxygen scavengers is included in the cleaning solution according to embodiments of the present invention. Some embodiments of the present invention include one or more oxygen scavengers present in the cleaning solution in amounts ranging from about 0 to 10000 ppm and all subranges subsumed therein. In another embodiment, the oxygen scavenger is present in the cleaning solution at a concentration between 1000 to 5000 ppm and all subranges subsumed therein. One or more embodiments of the present invention maintain concentrations of dissolved oxygen in the cleaning solution at less than 1 ppm. For some embodiments of the present invention, the low levels of dissolved oxygen are obtained by providing an effective amount of one or more oxygen scavengers.

Cleaning solutions according to specific embodiments of the present invention are, but are not limited to: A cleaning solution wherein the oxygen scavenger comprises L-ascorbic acid at a concentration between 0 to 10000 ppm and all subranges subsumed therein. A cleaning solution wherein the oxygen scavenger comprises L-ascorbic acid at a concentration between 1000 to 5000 ppm and all subranges subsumed therein.

Complexing Agent(s)/pH Adjustor(s)

The complexing agent in cleaning solutions according to some embodiments of the present invention have functional groups so as to be capable of forming complexes with metal ions and also have one or more functional groups so as to be capable of adjusting the pH of the cleaning solution. More specifically, the complexing agent is also capable of functioning as a pH adjustor so as to maintain the pH of the cleaning solution at or below about 3. Complexing agents for cleaning solutions according to embodiments of the present invention can be found in "Stability Constants of Metal-Ion Complexes: Inorganic Ligands, Organic Ligands; and Supplement," by Lars Gunnar Sillen and Arthur E. Martell, 2 Volume Set (Special Publication No. 17 and Supplement No. 1), 1972, which is incorporated herein in its entirety by this reference. A list of complexing agents capable of being a pH adjustor includes, but is not limited to, oxalic acid (CAS #[6153-56-6]), pyrophosphoric acid, hydroxyethylidene diphosphonic acid (CAS #[2809-21-4] also known as etidronic acid, ethane-1-hydroxy-1,1-diphosphonic acid, or HEDPA), phytic acid, malonic acid, maleic acid, and mixtures thereof.

Generally, cleaning solutions according to embodiments of the present invention contain an effective amount of complexing agent capable of functioning as a pH adjustor so as to form complexes with the metal ions removed from the surface of the substrate and to maintain the pH at the desired level. The specific amount required depends upon the properties of the complexing agent. For some embodiments of the present invention the amount of complexing agent is less than about 0.1 molar (M) in concentration or 50 grams/liter (g/L) in the case of polymeric acids in concentration.

Cleaning solutions according to embodiments of the present invention may have any one of numerous specific formulations. Examples of some optional specific formulations of cleaning solutions according to embodiments of the present invention wherein the cleaning solution comprises a corrosion inhibitor, a solubilizing agent, an oxygen scavenger, and a complexing agent also capable as a pH adjustor include but are not limited to the following.

The cleaning solution wherein the corrosion inhibitor comprises a triazole compound and the oxygen scavenger comprises L-ascorbic acid. The cleaning solution wherein the corrosion inhibitor comprises a toluol triazole or a benzotriazole and the oxygen scavenger comprises L-ascorbic acid. The cleaning solution wherein the corrosion inhibitor comprises a triazole compound at a concentration between 0.1 to 10000 ppm and all subranges subsumed therein and the oxygen scavenger comprises L-ascorbic acid. The cleaning solution wherein the corrosion inhibitor comprises a triazole compound at a concentration between 100 to 2000 ppm and all subranges subsumed therein and the oxygen scavenger comprises L-ascorbic acid. The cleaning solution wherein the complexing agent comprises oxalic acid, pyrophosphoric acid, hydroxyethylidene diphosphonic acid, phytic acid, malonic acid, maleic acid, or mixtures thereof.

The cleaning solution wherein the solubilizing agent comprises primary alcohol, secondary alcohol, tertiary alcohol, polyol, ethylene glycol, propylene glycol, 2-n-butoxyethanol, dimethylsulfoxide, propylenecarbonate, or combinations thereof. The cleaning solution wherein the solubilizing agent comprises dimethylsulfoxide. The cleaning solution wherein the solubilizing agent comprises isopropyl alcohol.

The cleaning solution wherein the corrosion inhibitor comprises a triazole compound; the solubilizing agent comprises one or more of dimethylsulfoxide, ethylene glycol, and isopropyl alcohol; the oxygen scavenger comprises L-ascorbic acid; and the complexing agent comprises oxalic acid, pyrophosphoric acid, hydroxyethylidene diphosphonic acid, phytic acid, malonic acid, maleic acid, or mixtures thereof. The cleaning solution wherein the corrosion inhibitor comprises a toluol triazole or a benzotriazole; the solvent comprises one or more of dimethylsulfoxide, ethylene glycol, and isopropyl alcohol; the oxygen scavenger comprises L-ascorbic acid; and the complexing agent comprises oxalic acid. The cleaning solution wherein the corrosion inhibitor comprises a triazole compound at a concentration between 0.1 to 10000 ppm and all subranges subsumed therein; the oxygen scavenger comprises L-ascorbic acid; and the complexing agent comprises oxalic acid. The cleaning solution wherein the corrosion inhibitor comprises a triazole compound at a concentration between 100 to 2000 ppm and all subranges subsumed therein; the oxygen scavenger comprises L-ascorbic acid; and the complexing agent comprises oxalic acid.

The cleaning solution wherein the oxygen scavenger comprises L-ascorbic acid at a concentration between 0 to 10000 ppm and all subranges subsumed therein; and the complexing agent comprises oxalic acid. The cleaning solution wherein the oxygen scavenger comprises L-ascorbic acid at a concentration between 1000 to 5000 ppm and all subranges subsumed therein; and the complexing agent comprises oxalic acid.

The cleaning solution wherein the complexing agent comprises oxalic acid, pyrophosphoric acid, hydroxyethylidene diphosphonic acid, phytic acid, malonic acid, maleic acid, or mixtures thereof at a concentration from about 2 g/L to about 50 g/L and all subranges subsumed therein. The cleaning solution wherein the corrosion inhibitor comprises a triazole compound at a concentration between about 0.1 to about 10000 ppm and all subranges subsumed therein; the solubilizing agent comprises one or more of dimethylsulfoxide, ethylene glycol, propylene glycol, 2-n-butoxyethanol, and isopropyl alcohol at a concentration up to about 200 mL/L; the oxygen scavenger comprises L-ascorbic acid at a concentration between 0 to about 10000 ppm and all subranges subsumed therein; and the complexing agent comprises oxalic acid at a concentration between about 0.5 to about 20 g/L and all subranges subsumed therein.

The cleaning solution wherein the corrosion inhibitor comprises a triazole compound at a concentration from about 100 to about 2000 ppm and all subranges subsumed therein; the solubilizing agent comprises one or more of dimethylsulfoxide, ethylene glycol, and isopropyl alcohol at a concentration from about 1 mL/L to about 200 mL/L and all subranges subsumed therein; the oxygen scavenger comprises L-ascorbic acid at a concentration from about 1000 to about 5000 ppm and all subranges subsumed therein; and the complexing agent comprises oxalic acid at a concentration between about 0.5 to about 20 g/L and all subranges subsumed therein.

The cleaning solution wherein the corrosion inhibitor comprises 5-methylbenzotriazole at a concentration of about 1 g/L; the solubilizing agent comprises ethylene glycol at a concentration of about 50 mL/L; the oxygen scavenger comprises L-(+)-ascorbic acid at a concentration of about 1 g/L; and the complexing agent comprises oxalic acid dihydrate at a concentration of about 10 g/L. The cleaning solution wherein the corrosion inhibitor is a triazole compound and the solubilizing agent comprises one or more of dimethylsulfoxide, ethylene glycol, and isopropyl alcohol.

The cleaning solution wherein the corrosion inhibitor comprises a toluol triazole or a benzotriazole and the solubilizing agent comprises one or more of dimethylsulfoxide, ethylene glycol, and isopropyl alcohol. The cleaning solution wherein the corrosion inhibitor is present at a concentration between about 0.1 to about 10000 ppm and all subranges subsumed therein and the solubilizing agent is present at a concentration up to about 200 mL/L. The cleaning solution wherein the corrosion inhibitor is present at a concentration between about 100 to about 2000 ppm and all subranges subsumed therein and the solubilizing agent is present at a concentration between about 1 mL/L to about 200 mL/L and all subranges subsumed therein. The cleaning solution wherein the corrosion inhibitor comprises a triazole compound at a concentration from 0.1 to 10000 ppm and all subranges subsumed therein and the solubilizing agent comprises one or more of dimethylsulfoxide, ethylene glycol, and isopropyl alcohol at a concentration up to about 200 mL/L. The cleaning solution wherein the corrosion inhibitor comprises a triazole compound at a concentration from 100 to 2000 ppm and all subranges subsumed therein and the solubilizing agent comprises one or more of dimethylsulfoxide, ethylene glycol, and isopropyl alcohol at a concentration from about 1 mL/L to about 200 mL/L and all subranges subsumed therein.

The cleaning solution wherein the corrosion inhibitor comprises 5-methylbenzotriazole at a concentration of about 1 g/L; the solubilizing agent comprises isopropyl alcohol at a concentration of about 50 mL/L; the oxygen scavenger comprises L-(+)-ascorbic acid at a concentration of about 1 g/L; and the complexing agent comprises oxalic acid dihydrate at a concentration of about 10 g/L. The cleaning solution wherein the corrosion inhibitor comprises 5-methylbenzotriazole at a concentration of about 1 g/L; the solubilizing agent comprises dimethylsulfoxide at a concentration up to about 1000 mL/L; the oxygen scavenger comprises L-(+)-ascorbic acid at a concentration of about 1 g/L; and the complexing agent comprises oxalic acid dihydrate at a concentration of about 10 g/L. The cleaning solution wherein the oxygen scavenger comprises D-ascorbic acid, a derivative of ascorbic acid, and/or a sulfite such as, but not limited to, ammonium sulfite and tetramethylammonium sulfite.

According to one embodiment of the present invention, the cleaning solution contains about 20 mL/L of dimethyl sulfoxide as the solubilizing agent. As an option for some embodiments of the present invention, the cleaning solution may be a non-aqueous solution comprising a non-aqueous solvent such as dimethyl sulfoxide. More specifically, the cleaning solution may comprise a non-aqueous solvent such as dimethyl sulfoxide having dissolved therein the corrosion inhibitor, the oxygen scavenger, and the complexing agent.

Section 2

Reference is now made to TABLE 1 where there is shown a list of formulations for cleaning solutions according to other embodiments of the present invention. The cleaning solutions include but are not limited to those shown in TABLE 1. The cleaning solutions may comprise a pH adjustor, an optional complexing agent, and a corrosion inhibitor. TABLE 1 also shows that the cleaning solutions may have a solubilizing agent optionally present, may have a surfactant optionally present, and may have a dielectric etchant optionally present.

TABLE 1

| ID | pH | pH Adjustor(s) | Corrosion Inhibitor(s) | Solubilizing Agent(s) | Surfactant(s) | Complexing Agent(s) | Dielectric Etchant(s) |
|---|---|---|---|---|---|---|---|
| 1 | ≤3 | P | P | | | | |
| 2 | ≤3 | P | P | P | | | |
| 3 | ≤3 | P | P | | P | | |
| 4 | ≤3 | P | P | P | P | | |
| 5 | ≤3 | P | P | | | P | |
| 6 | ≤3 | P | P | P | | P | |
| 7 | ≤3 | P | P | | P | P | |
| 8 | ≤3 | P | P | P | P | P | |
| 9 | ≤3 | P | P | | | | P |
| 10 | ≤3 | P | P | P | | | P |
| 11 | ≤3 | P | P | | P | | P |
| 12 | ≤3 | P | P | P | P | | P |
| 13 | ≤3 | P | P | | | P | P |
| 14 | ≤3 | P | P | P | | P | P |
| 15 | ≤3 | P | P | | P | P | P |
| 16 | ≤3 | P | P | P | P | P | P |
| 17 | ≤2 | P | P | | | | |
| 18 | ≤2 | P | P | P | | | |
| 19 | ≤2 | P | P | | P | | |
| 20 | ≤2 | P | P | P | P | | |
| 21 | ≤2 | P | P | | | P | |
| 22 | ≤2 | P | P | P | | P | |
| 23 | ≤2 | P | P | | P | P | |
| 24 | ≤2 | P | P | P | P | P | |
| 25 | ≤2 | P | P | | | | P |
| 26 | ≤2 | P | P | P | | | P |
| 27 | ≤2 | P | P | | P | | P |
| 28 | ≤2 | P | P | P | P | | P |
| 29 | ≤2 | P | P | | | P | P |
| 30 | ≤2 | P | P | P | | P | P |
| 31 | ≤2 | P | P | | P | P | P |
| 32 | ≤2 | P | P | P | P | P | P |

P - Present in the solution

As an option for some embodiments of the present invention, the cleaning solutions may be aqueous solutions having water as a major component of the cleaning solution. However, other embodiments of the present invention are cleaning solutions that may be non-aqueous solutions wherein a major component of the solution may be a non-aqueous liquid solvent.

Generally, cleaning solutions according to embodiments of the present invention have a pH less than or equal to 3. Optionally, the pH of the cleaning solution may be less than or equal to 2 for some embodiments. Preferred embodiments of the present invention include the cleaning solutions having a pH up to about 2.3.

pH Adjustor(s)

The pH adjustors in cleaning solutions according to some embodiments of the present invention have functional groups so as to be capable of maintaining the pH of the cleaning solution at a desired level of less than about 3. For specific embodiments of the present invention, this may mean that the pH adjustor has functional groups for producing an acidic cleaning solution. Optionally, the pH adjustor may also have capabilities as a complexing agent.

A list of pH adjustors for embodiments of the present invention includes, but is not limited to, sulphuric acid, sulfonic acids such as but not limited to methanesulfonic acid, benzene sulfonic acid, and triflic acid, hypophosphorous acid, oxalic acid, halogenated carboxylic acids such as but not limited to trifluoroacetic acid, acetylenedicarboxylic acid, squaric acid, dihydroxyfumaric acid, maleic acid, and mixtures thereof. As an option, the pH adjustor may include one or more acids having $pK_a$ equal to or less than 2, where $pK_a$ is the negative logarithm of the acid ionization constant, $K_a$, and the one or more acids being capable so as to adjust the cleaning solution to the desired acidic pH of less than or equal to 3. Alternatively, the pH adjustor may include one or more acids having $pK_a$ equal to or less than 1.5 and the one or more acids being capable so as to adjust the cleaning solution to the desired acidic pH of less than or equal to 3.

Generally, cleaning solutions according to embodiments of the present invention contain an effective amount of pH adjustor so as to maintain the pH at the desired level. The specific amount required depends upon the properties of the pH adjustor. For some embodiments of the present invention, the amount of complexing agent is between about 0 M to about 0.1 M in concentration or 50 g/L in the case of polymeric acids.

Complexing Agent(s)

The complexing agent in cleaning solutions according to some embodiments of the present invention has functional groups so as to be capable of forming complexes with metal ions. Complexing agents for cleaning solutions according to embodiments of the present invention can be found in "Stability Constants of Metal-Ion Complexes: Inorganic Ligands, Organic Ligands; and Supplement," by Lars Gunnar Sillen and Arthur E. Martell, 2 Volume Set (Special Publication No. 17 and Supplement No. 1), 1972, which is incorporated herein in its entirety by this reference. Numerous compounds are suitable for use as complexing agents in embodiments of the present invention. A list of complexing agents for embodiments of the present invention includes, but is not limited to, carboxylic acids, hydroxycarboxylic acids, citric acid, oxalic acid, phosphonic acids such as but not limited to hydroxyethylidene diphosphonic acid, phytic acid, and combinations thereof. Generally, cleaning solutions according to embodiments of the present invention contain an effective amount of complexing agent capable of forming complexes with the metal ions removed from the surface of the substrate. Some embodiments of the present invention include one or more complexing agents present in the cleaning solution in amounts ranging from about 0.1 mM to 200 mM concentration for each complexing agent.

Corrosion Inhibitor(s)

The corrosion inhibitors in cleaning solutions for embodiments of the present invention such as those presented in TABLE 1 are essentially the same as the corrosion inhibitors described above in Section 1.

Solubilizing Agent(s)

The solubilizing agents in cleaning solutions for embodiments of the present invention such as those presented in TABLE 1 are essentially the same as the solubilizing agents described above in Section 1.

Surfactant(s)

As an option, cleaning solutions according to some embodiments of the present invention may include one or more surfactants, i.e., surface active agents. The surfactant is included so as to provide adequate wetting of the substrate during the cleaning. Preferably, the entire surface of the substrate is adequately wetted by the cleaning solution so that the dielectric areas of the substrate are wetted and the cap areas of the substrate are wetted.

Numerous compounds are suitable for use as surfactants in embodiments of the present invention. A list of surfactants for embodiments of the present invention includes, but is not limited to, anionic surfactants, cationic surfactants, nonionic surfactants, amphoteric surfactants, and combinations thereof. Some of the anionic surfactants for some embodiments of the present invention are surfactants that have sulfate or sulfonate head groups. Cleaning solutions according to some embodiments of the present invention include one or more surfactants present in amounts ranging from about 0 ppm to about 2000 ppm for the active component of the formulation for each surfactant. The molecular weight of the surfactant is not always known.

Dielectric Etchant(s)

As an option, cleaning solutions according to some embodiments of the present invention may include one or more dielectric etchants. The dielectric etchant is a component of the cleaning solution that is capable of etching the dielectric layer of the substrate to be cleaned by the cleaning solution. The dielectric etchant is provided so as to facilitate removal of contaminants from the substrate. As indicated above, the dielectric layer typically is a dielectric used in electronic device fabrication. Typical dielectric layers comprise silicon and oxygen. One or more embodiments of the present invention include dielectric etchants for low k dielectrics such as carbon doped silicon oxide. A list of dielectric etchants for embodiments of the present invention include, but is not limited to, compounds such as hydrogen fluoride, hydrogen tetrafluoroborate, hydrogen hexafluorosilicate, non-alkali metal salts of fluoride, tetrafluoroborate, and hexafluorosilicate.

Optionally, the choice of the dielectric etchant and its concentration in the cleaning solution can be used as parameters to control the removal of a specific amount of metal contaminated surface of the dielectric layer. For some embodiments of the present invention, the amount of dielectric etchant in the cleaning solution is in the range of 1 mM to 100 mM.

Cleaning solutions according to embodiments of the present invention may have any one of numerous specific formulations. Examples of some optional specific formulations of cleaning solutions according to embodiments of the present invention wherein the cleaning solution comprises a pH adjustor, an optional complexing agent, and a corrosion inhibitor include but are not limited to the following.

The cleaning solution further comprising a solubilizing agent capable of solubilizing the corrosion inhibitor. The cleaning solution further comprising a solubilizing agent and a surfactant. The cleaning solution further comprising one or more of a solubilizing agent, a dielectric etchant, and a surfactant. The cleaning solution further comprising a solubilizing agent selected from the group consisting of primary alcohol, secondary alcohol, tertiary alcohol, polyol, ethylene glycol, propylene glycol, 2-n-butoxyethanol, dimethylsulfoxide, propylenecarbonate, and combinations thereof. The cleaning solution further comprising ethylene glycol. The cleaning solution further comprising isopropyl alcohol. The cleaning solution further comprising dimethylsulfoxide. The cleaning solution wherein the complexing agent includes oxalic acid, citric acid, hydroxyethylidene diphosphonic acid, or mixtures thereof.

The cleaning solution wherein the corrosion inhibitor comprises one or more of triazole, benzotriazole, methyl-benzotriazole, 5-methyl-benzotriazole, carboxy-benzotriazole, hydroxybenzotriazole, mercaptobenzothiazole, polyvinylpyrrolidone, polyvinylalcohol, polyamine, polyimine, polyalkylimine, polyethylenimine, long chain alkylamine, tetrazole, orthophosphate, metaphosphate, phosphite, phosphonate, fluoroalkylphosphate, silicate, alkylphosphonate, fluoroalkylphosphonate, alkoxysilane, nitrite, bicyclohexylammonium nitrite, derivatives thereof, and combinations thereof.

The cleaning solution wherein the surfactant comprises anionic surfactants, cationic surfactants, nonionic surfactants, amphoteric surfactants, or combinations thereof. The cleaning solution wherein the surfactant comprises a sulfate and/or a sulphonate.

The cleaning solution wherein the dielectric etchant etches silicon-oxygen compounds. The cleaning solution wherein the dielectric etchant comprises one or more of hydrogen fluoride, hydrogen tetrafluoroborate, hydrogen hexafluorosilicate, non-alkali metal salts of fluoride, tetrafluoroborate, hexafluorosilicate, and mixtures thereof.

Examples of some optional specific formulations of cleaning solutions according to embodiments of the present invention wherein the cleaning solution comprises a pH adjustor, an optional complexing agent, a corrosion inhibitor and one or more of a solubilizing agent, a dielectric etchant, and a surfactant, include but are not limited to the following.

The aqueous cleaning solution wherein the pH adjustor includes sulphuric acid, sulfonic acid, methanesulfonic acid, benzene sulfonic acid, triflic acid, hypophosphorous acid, oxalic acid, halogenated carboxylic acids, trifluoroacetic acid, acetylenedicarboxylic acid, squaric acid, dihydroxyfumaric acid, maleic acid, or mixtures thereof; the complexing agent includes oxalic acid, citric acid, hydroxyethylidene diphosphonic acid, phytic acid, or mixtures thereof; the corrosion inhibitor comprises triazole, benzotriazole, methyl-benzotriazole, 5-methyl-benzotriazole, carboxy-benzotriazole, hydroxybenzotriazole, mercaptobenzothiazole, polyvinylpyrrolidone, polyvinylalcohol, polyamine, polyimine, polyalkylimine, polyethylenimine, long chain alkylamine, tetrazole, orthophosphate, metaphosphate, phosphite, phosphonate, fluoroalkylphosphate, silicate, alkylphosphonate, fluoroalkylphosphonate, alkoxysilane, nitrite, bicyclohexylammonium nitrite, derivatives thereof, and combinations thereof; the solubilizing agent comprises one or more of dimethylsulfoxide, ethylene glycol, and isopropyl alcohol; the dielectric etchant comprises one or more of hydrogen fluoride, hydrogen tetrafluoroborate, hydrogen hexafluorosilicate, non-alkali metal salts of fluoride, tetrafluoroborate, hexafluorosilicate, and mixtures thereof; and the surfactant comprises anionic surfactants, cationic surfactants, non ionic surfactants, amphoteric surfactants, or combinations thereof; and the aqueous cleaning solution having a pH less than or equal to 3.

The aqueous cleaning solution wherein the pH adjustor has a concentration of between about 0 M to about 0.1 M and all ranges subsumed therein; the complexing agent has a concentration from about 0.1 mM to about 200 mM and all ranges subsumed therein; the corrosion inhibitor has a concentration from about 0.1 mM to about 50 mM and all ranges subsumed therein; the solubilizing agent has a concentration from about 0 mL/L to about 200 mL/L and all ranges subsumed therein; the dielectric etchant has a concentration from about 1 mM to about 100 mM and all ranges subsumed therein; and the surfactant has a concentration from about 0 ppm to about 2000 ppm and all ranges subsumed therein; and the aqueous cleaning solution having a pH less than or equal to 3.

The aqueous cleaning solution wherein the pH adjustor has a concentration of less than about 0.1 M and includes sulphuric acid, sulfonic acid, methanesulfonic acid, benzene sulfonic acid, triflic acid, hypophosphorous acid, oxalic acid, halogenated carboxylic acids, trifluoroacetic acid, acetylenedicarboxylic acid, squaric acid, dihydroxyfumaric acid, maleic acid, or mixtures thereof; the complexing agent has a concentration from about 0.1 mM to about 200 mM and includes carboxylic acids, hydroxycarboxylic acids, citric acid, oxalic acid, phosphonic acid, hydroxyethylidene diphosphonic acid, phytic acid, and combinations thereof, the corrosion inhibitor has a concentration from about 0.1 M to about 50 mM and comprises triazole, benzotriazole, methyl-benzotriazole, 5-methyl-benzotriazole, carboxy-benzotriazole, hydroxybenzotriazole, mercaptobenzothiazole, polyvinylpyrrolidone, polyvinylalcohol, polyamine, polyimine, polyalkylimine, polyethylenimine, long chain alkylamine, tetrazole, orthophosphate, metaphosphate, phosphite, phosphonate, fluoroalkylphosphate, silicate, alkylphosphonate, fluoroalkylphosphonate, alkoxysilane, nitrite, bicyclohexylammonium nitrite, derivatives thereof, and combinations thereof; the solubilizing agent is present at a concentration less than 200 mL/L and comprises one or more of primary alcohol, secondary alcohol, tertiary alcohol, polyol, ethylene glycol, propylene glycol, 2-n-butoxyethanol, dimethylsulfoxide, propylenecarbonate, and combinations thereof; the dielectric etchant is present at a concentration from about 1 mM to about 100 mM and comprises one or more of hydrogen fluoride, hydrogen tetrafluoroborate, hydrogen hexafluorosilicate, non-alkali metal salts of fluoride, tetrafluoroborate, hexafluorosilicate, and mixtures thereof; and the surfactant is present at a concentration of less than about 2000 ppm and comprises anionic surfactants, cationic surfactants, nonionic surfactants, amphoteric surfactants, or combinations thereof; and the aqueous cleaning solution has a pH less than or equal to 3.

Reference is now made to TABLE 2 where there are shown several optional cleaning solutions according to embodiments of the present invention. Generally, cleaning solutions from TABLE 2 include a corrosion inhibitor, a complexing agent, represented by A1 in TABLE 2, and a pH adjustor, represented by A2 in TABLE 2. The complexing agent A1 is an acid and may also have pH adjustor properties. The pH adjustor A2 is also an acid. For some embodiments of the present invention the pH adjustor A2 is a strong acid. Preferably the pH adjustor A2 is substantially non-complexing and is substantially non-oxidizing. It is also preferable that the pH adjustor A2 is a non-halide acid for some applications of the cleaning solution. The cleaning solutions may include an optional solubilizing agent and/or an optional surfactant. For some embodiments, the cleaning solutions have a pH less than about three. Optionally, the pH may be less than about two.

TABLE 2

| ID | pH | Complexing Agent(s) | pH Adjustor(s) | Corrosion Inhibitor(s) | Solubilizing Agent(s) | Surfactant(s) |
|---|---|---|---|---|---|---|
| 33 | ≤3 | P-A1 | P-A2 | P | P | |
| 34 | ≤3 | P-A1 | P-A2 | P | P | P |
| 35 | ≤3 | P-A1 | P-A2 | P | | |
| 36 | ≤3 | P-A1 | P-A2 | P | | P |
| 37 | ≤2 | P-A1 | P-A2 | P | P | |
| 38 | ≤2 | P-A1 | P-A2 | P | P | P |
| 39 | ≤2 | P-A1 | P-A2 | P | | |
| 40 | ≤2 | P-A1 | P-A2 | P | | P |

A1 - Complexing agent(s) that may also have pH adjusting properties.
A2 - pH Adjustor that is an acid that is non-complexing, non-oxidizing, and non-halide.
P - Present in the solution Examples of some optional specific formulations of cleaning solutions according to embodiments of the present invention presented in TABLE 2 include but are not limited to the following. The aqueous cleaning solution wherein the pH adjustor is substantially non-complexing. The aqueous cleaning solution wherein the pH adjustor comprises a first acid and the complexing agent comprises a second acid. The aqueous cleaning solution wherein the pH adjustor comprises a strong acid. The aqueous cleaning solution wherein the pH adjustor includes sulphuric acid, sulfonic acid, methanesulfonic acid, benzene sulfonic acid, triflic acid, hypophosphorous acid, oxalic acid, halogenated carboxylic acids, trifluoroacetic acid, acetylenedicarboxylic acid, squaric acid, dihydroxyfumaric acid, maleic acid, or mixtures thereof; and the complexing agent includes oxalic acid, citric acid, hydroxyethylidene diphosphonic acid, or mixtures thereof.

As an option, the process of cleaning substrates using cleaning solutions according to embodiments of the present invention can be performed using a brush to apply the cleaning solution to the substrate. Alternatively, the process can be performed by applying the cleaning solution to the substrate by methods such as dipping or immersing the substrate into the cleaning solution, such as rinsing the substrate with the cleaning solution, such as spraying the cleaning solution onto the substrate, and such as applying the cleaning solution using a proximity head. The cleaning efficiency of cleaning solutions according to embodiments of the present invention can be enhanced further by using processes such as applying ultrasonic or megasonic energy to the substrate during cleaning and/or by using elevated temperatures during the cleaning. For some applications, the cleaning solutions are used at temperatures in the range from about 5° C. to about 90° C. Cleaning solutions according to embodiments of the present invention can be applied to clean substrates after deposition of a cap layer.

In the foregoing specification, the invention has been described with reference to specific embodiments. However, one of ordinary skill in the art appreciates that various modifications and changes can be made without departing from the scope of the present invention as set forth in the claims below. Accordingly, the specification is to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," "includes," "including," "has," "having," "at least one of," or any other variation thereof, are intended to cover a non-exclusive inclusion. For example, a process, method, article, or apparatus that comprises a list of elements is not necessarily limited only to those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

What is claimed is:

1. An aqueous cleaning solution for removing metal contaminants from a dielectric structure with electrolessly deposited cobalt or cobalt alloy caps after electrolessly depositing the cobalt or cobalt alloy caps over metal lines in the dielectric structure, comprising:
   a pH adjustor;
   a complexing agent comprising phytic acid;
   a corrosion inhibitor capable so as to protect electrolessly deposited cobalt or cobalt alloy caps on metal lines over the dielectric structure; and
   one or more of:
      a solubilizing agent,
      a dielectric etchant, and
      a surfactant; and
   wherein the aqueous cleaning solution is capable so as to remove metal ions from the dielectric structure, wherein:
      the pH adjustor has a concentration of less than 0.1 M and includes at least one of a sulphuric acid, sulfonic acid, methanesulfonic acid, benzene sulfonic acid, triflic acid, hypophosphorous acid, oxalic acid, halogenated carboxylic acids, trifluoroacetic acid, acetylenedicarboxylic acid, squaric acid, dihydroxyfumaric acid, maleic acid, or mixtures thereof;
      the complexing agent has a concentration from 0.1 to 200 mM;
      the corrosion inhibitor has a concentration from 0.1 to 50 mM and comprises at least one of a triazole, benzotriazole, methyl-benzotriazole, 5-methyl-benzotriazole, carboxy-benzotriazole, hydroxybenzotriazole, mercaptobenzothiazole, polyvinylpyrrolidone, polyvinylalcohol, polyamine, polyimine, polyalkylimine, polyethylenimine, long chain alkylamine, tetrazole, phosphate, inorganic phosphate, alkylphosphate, metaphosphate, phosphite, phosphonate, fluoroalkylphosphate, silicate, alkylphosphonate, fluoroalkylphosphonate, alkoxysilane, nitrite, bicyclohexylammonium nitrite, or combinations thereof;
      the solubilizing agent is present at a concentration less than 200 mL/L and comprises one or more of a primary alcohol, secondary alcohol, tertiary alcohol, polyol, ethylene glycol, propylene glycol, 2-n-butoxyethanol, dimethylsulfoxide, propylenecarbonate, or combinations thereof;
      the dielectric etchant is present at a concentration from 1 to 100 mM and comprises one or more of a hydrogen fluoride, hydrogen tetrafluoroborate, hydrogen hexafluorosilicate, non-alkali metal alt of fluoride, tetrafluoroborate, hexafluorosilicate, or mixtures thereof;
      the surfactant is present at a concentration of less than 2000 ppm and comprises at least one of anionic surfactants, cationic surfactants, nonionic surfactants, amphoteric surfactants, or combinations thereof; and
      the aqueous cleaning solution has a pH less than or equal to 3.

2. An aqueous cleaning solution for removing metal contaminants from a dielectric structure with electrolessly deposited cobalt or cobalt alloy caps after electrolessly depositing the cobalt or cobalt alloy caps over metal lines in the dielectric structure, comprising:
   a pH adjustor;
   a complexing agent comprising phytic acid;
   a corrosion inhibitor capable so as to protect electrolessly deposited cobalt or cobalt alloy caps on metal lines over the dielectric structure; and
   one or more of:
      a solubilizing agent, wherein the solubilizing agent comprises one or more of dimethylsulfoxide, ethylene glycol, propylene glycol, 2-n-butoxyethanol, or isopropyl alcohol a dielectric etchant, and
a surfactant; and
wherein the aqueous cleaning solution is capable so as to remove metal ions from the dielectric structure.

3. An aqueous cleaning solution for removing metal contaminants from a dielectric structure with electrolessly deposited cobalt or cobalt alloy caps after electrolessly depositing the cobalt or cobalt alloy caps over metal lines in the dielectric structure, comprising:
a pH adjustor comprising hypophosphorous acid, squaric acid, dihydroxyfumaric acid, or mixtures thereof;
a complexing agent comprising phytic acid;
a corrosion inhibitor capable so as to protect an electrolessly deposited cobalt or cobalt alloy caps on a metal lines over the dielectric structure; and
one or more of:
a solubilizing agent,
a dielectric etchant, and
a surfactant; and
wherein the aqueous cleaning solution is capable so as to remove metal ions from the dielectric structure.

4. The aqueous cleaning solution of claim 3, wherein:
the complexing agent further comprises at least one of carboxylic acids, hydroxycarboxylic acids, citric acid, oxalic acid, phosphonic acid, hydroxyethylidene diphosphonic acid, or mixtures thereof;
the corrosion inhibitor comprises at least one of a triazole, benzotriazole, methyl-benzotriazole, 5-methyl-benzotriazole, carboxy-benzotriazole, hydroxybenzotriazole, mercaptobenzothiazole, polyvinylpyrrolidone, polyvinylalcohol, polyamine, polyimine, polyalkylimine, polyethylenimine, long chain alkylamine, tetrazole, phosphate, inorganic phosphate, alkylphosphate, metaphosphate, phosphite, phosphonate, fluoroalkylphosphate, silicate, alkylphosphonate, fluoroalkylphosphonate, alkoxysilane, nitrite, bicyclohexylammonium nitrite, or combinations thereof;
the solubilizing agent comprises one or more of a dimethylsulfoxide, ethylene glycol, propylene glycol, 2-n-butoxyethanol, or isopropyl alcohol;
the dielectric etchant comprises one or more of a hydrogen fluoride, hydrogen tetrafluoroborate, hydrogen hexafluorosilicate, non-alkali metal salts of fluoride, tetrafluoroborate, hexafluorosilicate, or mixtures thereof;
the surfactant comprises at least one of anionic surfactants, cationic surfactants, nonionic surfactants, amphoteric surfactants, or combinations thereof; and
the aqueous cleaning solution has a pH less than or equal to 3.

5. The aqueous cleaning solution of claim 3, wherein:
the pH adjustor has a concentration of less than 0.1 M;
the complexing agent has a concentration from 0.1 to 200 mM and further comprises at least one of a carboxylic acid, hydroxycarboxylic acid, citric acid, oxalic acid, phosphonic acid, hydroxyethylidene diphosphonic acid, or combinations thereof;
the corrosion inhibitor has a concentration from 0.1 to 50 mM and comprises at least one of a triazole, benzotriazole, methyl-benzotriazole, 5-methyl-benzotriazole, carboxy-benzotriazole, hydroxybenzotriazole, mercaptobenzothiazole, polyvinylpyrrolidone, polyvinylalcohol, polyamine, polyimine, polyalkylimine, polyethylenimine, long chain alkylamine, tetrazole, phosphate, inorganic phosphate, alkylphosphate, metaphosphate, phosphite, phosphonate, fluoroalkylphosphate, silicate, alkylphosphonate, fluoroalkylphosphonate, alkoxysilane, nitrite, bicyclohexylammonium nitrite, or combinations thereof;
the solubilizing agent is present at a concentration less than 200 mL/L and comprises one or more of a primary alcohol, secondary alcohol, tertiary alcohol, polyol, ethylene glycol, propylene glycol, 2-n-butoxyethanol, dimethylsulfoxide, propylenecarbonate, or combinations thereof;
the dielectric etchant is present at a concentration from 1 to 100 mM and comprises one or more of a hydrogen fluoride, hydrogen tetrafluoroborate, hydrogen hexafluorosilicate, non-alkali metal salts of fluoride, tetrafluoroborate, hexafluorosilicate, or mixtures thereof;
the surfactant is present at a concentration of less than 2000 ppm and comprises at least one of anionic surfactants, cationic surfactants, nonionic surfactants, amphoteric surfactants, or combinations thereof; and
the aqueous cleaning solution has a pH less than or equal to 3.

6. The aqueous cleaning solution of claim 3, wherein:
the complexing agent further comprises at least one of carboxylic acids, hydroxycarboxylic acids, citric acid, oxalic acid, phosphonic acid, hydroxyethylidene diphosphonic acid, or mixtures thereof.

7. The aqueous cleaning solution of claim 3, wherein:
the corrosion inhibitor comprises at least one of a triazole, benzotriazole, methyl-benzotriazole, 5-methyl-benzotriazole, carboxy-benzotriazole, hydroxybenzotriazole, mercaptobenzothiazole, polyvinylpyrrolidone, polyvinylalcohol, polyamine, polyimine, polyalkylimine, polyethylenimine, long chain alkylamine, tetrazole, phosphate, inorganic phosphate, alkylphosphate, metaphosphate, phosphite, phosphonate, fluoroalkylphosphate, silicate, alkylphosphonate, fluoroalkylphosphonate, alkoxysilane, nitrite, bicyclohexylammonium nitrite, or combinations thereof.

8. The aqueous cleaning solution of claim 3, wherein:
the dielectric etchant comprises one or more of a hydrogen fluoride, hydrogen tetrafluoroborate, hydrogen hexafluorosilicate, non-alkali metal salts of fluoride, tetrafluoroborate, hexafluorosilicate, or mixtures thereof.

9. The aqueous cleaning solution of claim 3, wherein:
the solubilizing agent comprises one or more of dimethylsulfoxide, ethylene glycol, propylene glycol, 2-n-butoxyethanol, or isopropyl alcohol.

10. The aqueous cleaning solution of claim 3, wherein:
the pH adjustor has a concentration of between 0 to 0.1 M;
the complexing agent has a concentration from 0.1 to 200 mM;
the corrosion inhibitor has a concentration from 0.1 to 50 mM;
the solubilizing agent has a concentration from 0 to 200 mL/L;
the dielectric etchant has a concentration from 1 to 100 mM;
the surfactant has a concentration from 0 to 2000 ppm; and
the aqueous cleaning solution has a pH less than or equal to 3.

11. An aqueous cleaning solution for removing metal contaminants from a dielectric structure with electrolessly deposited cobalt or cobalt alloy caps after electrolessly depositing the cobalt or cobalt alloy caps over metal lines in the dielectric structure, comprising:
a pH adjustor;
a complexing agent comprising phytic acid;
a corrosion inhibitor capable so as to protect electrolessly deposited cobalt or cobalt alloy caps on metal lines over the dielectric structure; and one or more of:
 a solubilizing agent, wherein:
the pH adjustor has a concentration of less than 0.1 M and comprises hypophosphorous acid, squaric acid, dihydroxyfumaric acid, or mixtures thereof;
the complexing agent has a concentration from 0.1 to 200 mM;
the dielectric etchant is present at a concentration from 1 to 100 mM and comprises one or more of a hydrogen tetrafluoroborate, hydrogen hexafluorosilicate, tetrafluoroborate, hexafluorosilicate, and mixtures thereof; and
the aqueous cleaning solution has a pH less than or equal to 3.

* * * * *